United States Patent [19]

Mihalich et al.

[11] 4,300,061
[45] Nov. 10, 1981

[54] CMOS VOLTAGE REGULATOR CIRCUIT

[75] Inventors: Stephen K. Mihalich; Curtis J. Dicke, both of Santa Clara, Calif.

[73] Assignee: National Semiconductor Corporation, Santa Clara, Calif.

[21] Appl. No.: 20,568

[22] Filed: Mar. 15, 1979

[51] Int. Cl.³ .......................... G05F 3/08; G05F 3/16; H01L 27/04; H01L 29/78
[52] U.S. Cl. .................................. 307/297; 323/313; 357/42
[58] Field of Search .................... 307/297, 304; 323/1, 323/4, 9, 22 R, 312–315; 357/42

[56] References Cited

U.S. PATENT DOCUMENTS

| | | | |
|---|---|---|---|
| 3,806,742 | 4/1974 | Powell | 307/297 X |
| 3,823,332 | 7/1974 | Feryszka et al. | 307/297 |
| 3,983,620 | 10/1976 | Spadea | 357/42 X |
| 4,006,491 | 2/1977 | Alaspa et al. | 357/42 X |
| 4,024,415 | 5/1977 | Matsuura | 307/304 X |
| 4,096,430 | 6/1978 | Waldron | 357/42 X |
| 4,100,437 | 7/1978 | Hoff, Jr. | 307/297 |
| 4,128,816 | 12/1978 | Shimotsuma | 323/16 X |
| 4,217,535 | 8/1980 | Suzuki et al. | 307/304 X |
| 4,217,540 | 8/1980 | Shimotsuma | 323/22 R |

*Primary Examiner*—Larry N. Anagnos
*Attorney, Agent, or Firm*—Gail W. Woodward; James A. Sheridan

[57] ABSTRACT

A CMOS integrated circuit chip includes a conventional high voltage section and a low voltage section. An on-chip voltage regulator develops a second or pseudo substrate potential at a node that is regulated to a level that is the sum of the thresholds for NMOS and PMOS devices below the $V_{DD}$ potential. The low voltage section is connected between $V_{DD}$ and the second substrate potential node. The low voltage section is, therefore, always operated at optimum voltage regardless of device threshold voltage variations that are encountered in CMOS manufacturing. This means that even though the integrated circuit includes a low voltage section, it can be operated over the normal CMOS voltage range as if it contained only high voltage devices.

10 Claims, 4 Drawing Figures

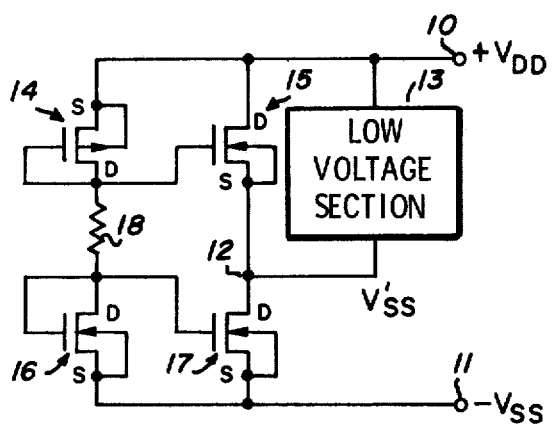
Fig_1
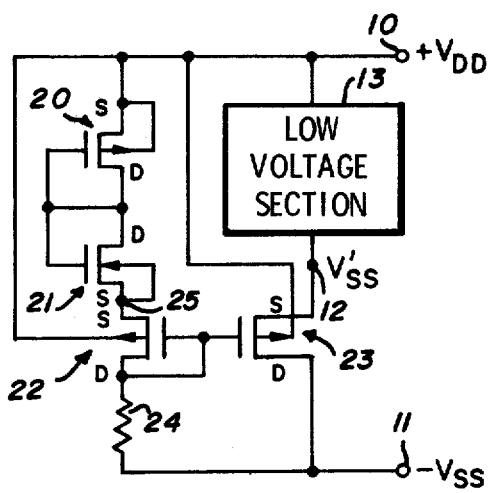
Fig_2
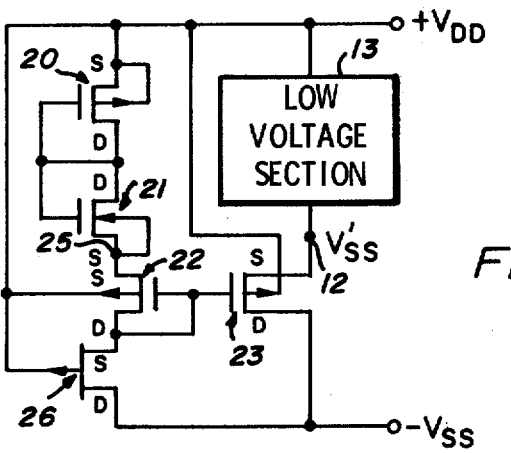
Fig_3
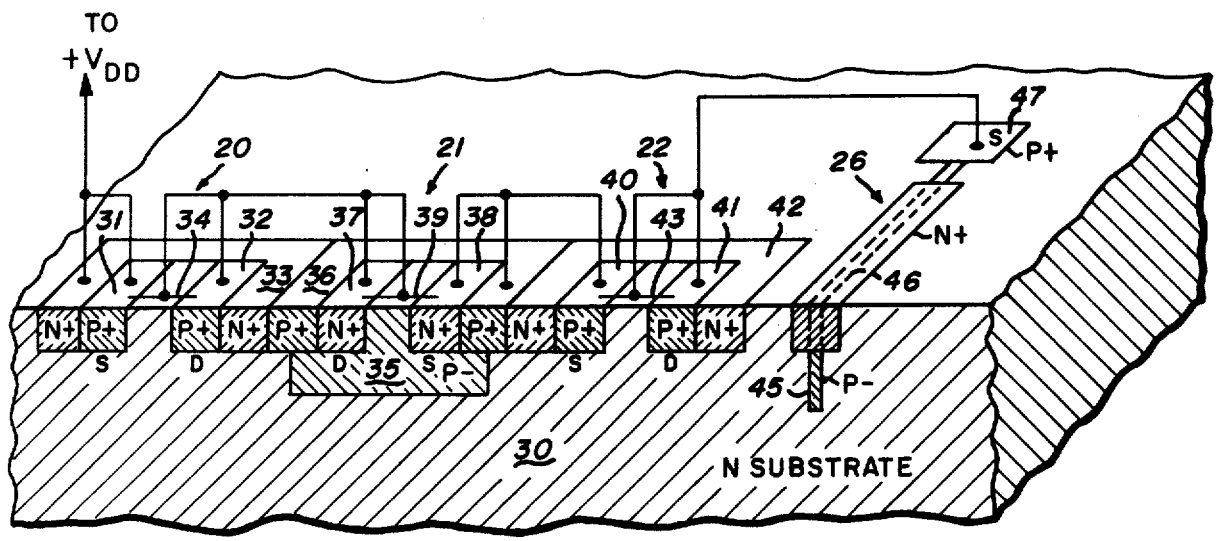
Fig_4

4,300,061

CMOS VOLTAGE REGULATOR CIRCUIT

BACKGROUND OF THE INVENTION

Complementary metal oxide semiconductor (CMOS) devices are well-known in the semiconductor art. This class of device employs n channel transistors (NMOS) and p channel transistors (PMOS) in circuit configurations that have many superior qualities that are well appreciated. In conventional CMOS products operation is usually specified over the voltage range of 3 to 15 volts. However, the circuits can commonly operate up to 18 volts. These are referred to as high voltage devices. In order to increase circuit density for improved utilization of integrated circuit (IC) chip area, device spacings have been reduced to a minimum to create a new class of devices known as high density, low voltage CMOS. These devices normally have an upper voltage limit of about 7 volts.

The physical differences can readily be seen in U.S. Pat. No. 3,983,620 which issued to Gregorio Spadea on Oct. 5, 1976, and is assigned to the assignee of the present invention. This patent discloses a number of CMOS structures. FIG. 15 illustrates, in cross section showing, a high voltage structure. FIG. 19 shows a similar low voltage structure. It can be seen so that the major difference is that in the low voltage construction, the space between N+ guard rings and the P+ regions has been eliminated. This results in a voltage limit defined by the zener voltage of the P+ to N+ junctions.

While the high density construction has an upper voltage limit of about 7 volts, this is not ordinarily a problem. In terms of low voltage limits the constraints are conventional. The lowest operating limit is established by the higher of the thresholds of the PMOS and NMOS devices. The optimum operating voltage is equal to the sum of the thresholds for the PMOS and NMOS devices (hereafter to be referred to as sum of thresholds). At this voltage, the CMOS inverters operate at maximum speed-power product and gain. Clearly operation at sum of thresholds is desirable, but this value varies substantially in the device manufacturing process. One approach is to use an operating voltage sufficiently high to exceed sum of thresholds for worst case device tolerances. Alternatively, a voltage regulator is employed to power the circuit and the regulator is supplied with a reference voltage developed by sensing the sum of thresholds for on-chip p and n channel devices. The regulator then maintains the voltage across the low voltage section at its optimum value. As the transistor threshold values vary, as a result of the inevitable variations encountered in IC manufacture, such a regulator will automatically produce the desired voltage.

The prior art has recognized the usefulness of the constancy of a transistor threshold for use as a voltage regulator reference. However, most of the prior art circuits employ all p channel or n channel devices. Other prior art examples, such as U.S. Pat. No. 4,061,962, employ other semiconductor devices such as pn junction diodes in their circuits and commonly reference the regulated voltage to $V_{SS}$ or ground. For example, in U.S. Pat. No. 4,128,816, a junction diode and a bipolar transistor are employed to translate a threshold reference value. In other approaches, such as the one in U.S. Pat. No. 4,100,437, a voltage regulator uses a transistor threshold as a reference, but employs level shifting to obtain a regulated voltage of the desired magnitude.

SUMMARY OF THE INVENTION

It is an object of the invention to provide a sum of thresholds regulator circuit that can be incorporated into a conventional CMOS chip that includes a low voltage section and a high voltage section.

It is a further object of the invention to provide a regulator circuit for developing a potential that is regulated to be the sum of thresholds below $V_{DD}$ on a CMOS IC chip and to apply this potential to a low voltage section substrate connection.

These and other objects are achieved using a CMOS circuit configured as follows. An IC chip is fabricated with a low voltage section on a common substrate with a high voltage section. This provides a common $V_{DD}$ substrate connection. The high voltage section is coupled to an external power supply by way of a $V_{SS}$ terminal for single supply operation as a conventional CMOS device. On the chip, a regulator is employed to sense sum of thresholds and to apply a potential to the low voltage circuit portion that is the sum of thresholds below $V_{DD}$. Thus, as threshold values vary as a result of processing variables, the optimum voltage is automatically supplied to the low voltage high circuit density section.

BRIEF DESCRIPTION OF THE DRAWING

FIG. 1 is a diagram showing a regulator circuit constructed in accordance with the invention;

FIG. 2 is a diagram of an alternative circuit to that of FIG. 1;

FIG. 3 is a diagram of an improved version of FIG. 2; and

FIG. 4 is a front elevation cross section view of a portion of a semiconductor circuit chip showing the construction of part of the circuit of FIG. 3.

DESCRIPTION OF THE INVENTION

FIG. 1 is a circuit that illustrates the invention. Terminals 10 and 11 represent the power supply rails and are marked $+V_{DD}$ and $-V_{SS}$ respectively to denote where a typical CMOS power supply is connected. This would commonly represent the typical 3 to 15 volt supply. Circuit node 12 represents $V_{SS}'$ which is to be operated at the sum of thresholds below $V_{DD}$ for operating the low voltage high circuit density section that is denoted as block 13.

Four CMOS transistors 14–17 are employed. Transistor 17 should be of high voltage construction, but transistors 14–16 can be of either high or low voltage construction as desired. Transistors 14 and 16 have their gate electrodes connected to their respective drain electrodes and are coupled in series with resistor 18 across power supply terminals 10 and 11. Resistor 18 is typically a high value, in the range of 1–5 megohms, so that only a small current, on the order of microamperes, will flow in transistors 14 and 16. Transistors 15 and 17 have their source drain circuits coupled in series across supply terminals 10 and 11. The gate of transistor 15 is biased by the voltage drop across transistor 14 and the gate of transistor 17 is biased by the voltage drop across transistor 16. It will be noted that both transistors 14 and 15 have their substrate connections returned to their respective source electrodes and will therefore be substantially free of body effect.

The voltage drop across transistor 14 will be one threshold of a PMOS transistor. Due to the action of transistor 15, circuit node 12 will be one NMOS transistor threshold below the drain electrode of transistor 14. Thus, node 12 will be biased at the sum of thresholds below $V_{DD}$. Transistor 17 operates as a current sink to conduct the combined currents of transistor 15 and low voltage section 13.

If the potential at node 12 attempts to vary as a result of a change in current in the low voltage section 13, conduction in transistor 15 will vary to compensate. In effect, node 12 is looking into transistor 15 connected as a source follower. Thus, the current in transistor 17 is stabilized and constant. Transistor 15 must be of sufficient size to accommodate the current changes presented by low voltage section 13 and transistor 17 must be of sufficient size to accommodate the total current of section 13 and transistor 15. Transistors 14 and 16 can both be relatively small, their size being dictated by the few microamperes that flow through resistor 18 at the maximum supply voltage. (For example, with a 15 volt supply at terminals 10 and 11 most of this voltage will appear across resistor 18.)

In the alternative circuit of FIG. 2, an active source follower is used to control the potential of node 12 to develop $V_{SS}'$. Complementary transistors 20 and 21 have their gate electrodes coupled to their respective drains and are series connected to develop a sum of thresholds potential below $V_{DD}$ at node 25. The current flowing in transistors 20 and 21 also flows through transistor 22 and resistor 24. The potential at the gate of transistor 22 will be three thresholds below $V_{DD}$. This point is directly connected to the gate of source follower transistor 23. Since the thresholds of transistors 22 and 23 will be substantially equal and cancel, node 12 will be at sum of thresholds below $V_{DD}$. Thus the source of transistor 23, which is connected as a source follower, will actively reproduce a potential at terminal 12 equal to sum of thresholds below $V_{DD}$. It can be seen that the current flowing in resistor 124 will be a function of the voltage existing between terminals 10 and 11. While the current is small its variability can be of concern.

The circuit of FIG. 3 reduces the current variation substantially. The circuit is the same as that of FIG. 2 except that resistor 24 has been replaced by a junction field effect transistor (JFET) 26. A p channel device is shown with its source-drain circuit coupled in series with transistors 20, 21, and 22. Its gate is returned to $V_{DD}$ so as to actively pinch its conduction. Since the gate to source potential of transistor 26 is fixed at about three thresholds (the thresholds of transistors 20, 21, and 22), its conductance will decrease with increased source to drain voltage. Thus, even though the supply voltage varies over wide limits there will be very little change in current flow. This is desirable from a circuit operation standpoint and also helps to stabilize the bias voltages in transistors 20, 21, and 22. As a practical matter it is easy to fabricate a JFET into a CMOS substrate. The L/W ratio is made large enough to establish the desired current. Typically ratios on the order of 100:1 have proven to be useful.

FIG. 4 shows a useful form of IC construction for transistors 20, 21, 22 and 26. The drawing shows a portion of an IC in cross section with a front elevation view to illustrate part of the chip topography. The drawing is not to scale because it is intended only to illustrate the well-known IC fabrication concepts involved in the invention. The upper oxide and metallization layers have been omitted and the circuit interconnections shown in schematic form. While the topography illustrated employs low voltage construction, the well-known high voltage construction could be used.

The IC fragment employs an n type substrate 30. Transistor 20 includes a pair of diffused P+ type regions 31 and 32 to create its source and drain electrodes respectively. N+ type guard ring 33 surrounds the device and is connected to source 31 to provide an ohmic connection to substrate 30 which is coupled to $+V_{DD}$ as shown. Gate electrode 34 is connected to drain 32 and to transistor 21.

N channel transistor 21 is fabricated into a p− type well 35 which is ringed by p+ guard ring 36. Drain 37 is connected to transistor 20 and gate electrode 39. Source 38 is connected to guard ring 36 and transistor 22.

P channel transistor 22 is constructed like transistor 20 and includes source 40 connected to transistor 21 and drain 41 connected to gate 43 and transistor 26. Guard ring 42 surrounds transistor 22.

JFET 26 is made up from a p− channel 45 fabricated from a p− well diffusion such as the one at 35. The channel is made very narrow and is capped by top gate 46 which is an n+ diffusion similar to the diffusion used for guard rings 33 and 42. This top gate is directly and ohmically connected to substrate 30. Channel 45 terminates in a p+ diffusion 47 which comprises its source and is connected to transistor 22. While not shown, the other end of channel 45 will terminate in a second p+ diffusion which will serve as the drain electrode and is connected to $-V_{SS}$. The channel length is typically made to be long enough to produce the desired conductivity for transistor 26.

The invention has been described and suitable circuitry detailed for practicing the invention. Clearly there are alternatives and equivalents that are within the spirit and intent of the invention and will occur to a person skilled in the art. Therefore, it is intended that the scope of the invention be limited only by the claims that follow.

We claim:

1. In a CMOS integrated circuit chip having PMOS and NMOS transistors fabricated on a common physical substrate which contains a first section constructed for high voltage along with a second high device density section constructed for low voltage, said first and second sections having a common substrate electrically connectible to a first power supply terminal and having a common low voltage node, said second section having a high voltage node connectible to a second power supply terminal, a regulator circuit for regulating the potential at said common low voltage node, said regulator circuit comprising:

means for developing a first voltage equal to the sum of the threshold voltages of a PMOS transistor and an NMOS transistor;

means for subtracting said first voltage from the potential at said first terminal to develop a reference potential equal to common low voltage node potential; and means for coupling said reference potential to said common low voltage node, said means for coupling including means for stabilizing the potential at said common low voltage node.

2. The circuit of claim 1 wherein said PMOS and NMOS transistors each have their gate electrodes coupled directly to their respective drain electrodes and said threshold voltage appears between source and drain electrodes.

3. The circuit of claim 2 wherein said means for developing a first voltage includes means for passing equal currents through said PMOS and NMOS transistors and wherein each of said PMOS and NMOS transistors have its body portions coupled to its respective source electrodes whereby said first voltage is not influenced by body effect in said transistors.

4. The circuit of claim 3 wherein said means for stabilizing includes a transistor in said first section connected to supply the current passed by said second section.

5. The circuit of claim 4 wherein said means for developing said first voltage includes means for connecting said PMOS transistor in series with said NMOS transistor and coupling said transistors in series with voltage dropping means across said first and second power supply terminals.

6. The circuit of claim 5 wherein said voltage dropping means comprise a resistor.

7. The circuit of claim 5 wherein said voltage dropping means comprise an on chip JFET.

8. A CMOS integrated circuit comprising:
a semiconductor substrate of a first conductivity type;
first and second transistors each having source and drain electrodes of a second conductivity type diffused into said substrate and a gate electrode;
a third transistor created in a well of said second conductivity type diffused into said substrate, said third transistor having source and drain electrodes of said first conductivity type diffused into said well and a gate electrode;
means for coupling said first, third, and second transistor source-drain electrodes in series configuration, so that the same current flows therethrough;
means for coupling said source of said first transistor to said substrate;
means for coupling said gate of said first transistor to said gate of said third transistor, the drain of said first transistor, and the drain of said third transistor;
means for coupling the source of said third transistor to said well;
means for coupling said gate of said second transistor to said drain of said second transistor;
a first ring of said first conductivity type diffused into said substrate around said first transistor to provide a guard ring and an ohmic connection to said substrate; and
a second ring of said second conductivity type diffused into said substrate in registry with the edges of said well thereby providing an ohmic connection to said well and a guard ring for said third transistor.

9. The integrated circuit of claim 8 wherein said first and second rings abut each other.

10. The integrated circuit of claim 9 wherein said first conductivity type is N and said second conductivity type is P.

* * * * *